(12) United States Patent
Kang et al.

(10) Patent No.: US 12,382,761 B2
(45) Date of Patent: Aug. 5, 2025

(54) DISPLAY DEVICE USING A SEMICONDUCTOR LIGHT EMITTING DEVICE AND MANUFACTURING METHOD THEREOF

(71) Applicant: LG ELECTRONICS INC., Seoul (KR)

(72) Inventors: Eunjeong Kang, Seoul (KR); Byungjoon Rhee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 579 days.

(21) Appl. No.: 17/254,683

(22) PCT Filed: Feb. 20, 2020

(86) PCT No.: PCT/KR2020/002453
§ 371 (c)(1),
(2) Date: Dec. 21, 2020

(87) PCT Pub. No.: WO2021/006450
PCT Pub. Date: Jan. 14, 2021

(65) Prior Publication Data
US 2022/0190220 A1    Jun. 16, 2022

(30) Foreign Application Priority Data
Jul. 11, 2019   (KR) .................. 10-2019-0084033

(51) Int. Cl.
*H10H 20/857*   (2025.01)
*H10H 20/831*   (2025.01)
*G06F 1/16*     (2006.01)

(52) U.S. Cl.
CPC ........ *H10H 20/857* (2025.01); *H10H 20/831* (2025.01); *G06F 1/1652* (2013.01)

(58) Field of Classification Search
None
See application file for complete search history.

(56) References Cited

U.S. PATENT DOCUMENTS

| | | | |
|---|---|---|---|
| 6,365,840 B1 * | 4/2002 | Honda | H01L 24/31 |
| | | | 361/779 |
| 10,193,042 B1 * | 1/2019 | Tsai | H01L 33/62 |
| | (Continued) | | |

FOREIGN PATENT DOCUMENTS

| | | |
|---|---|---|
| CN | 102903856 A | 1/2013 |
| KR | 10-2013-0137985 A | 12/2013 |
| | (Continued) | |

*Primary Examiner* — Su C Kim
(74) *Attorney, Agent, or Firm* — Birch, Stewart, Kolasch & Birch, LLP

(57) ABSTRACT

The present invention includes a substrate, a wiring electrode disposed on the substrate, a plurality of semiconductor light emitting devices electrically connected to the wiring electrode, and an anisotropic conduction comprising a mixture of conductive particles and an insulating material disposed between the semiconductor light emitting devices and a light transmitting layer formed between the semiconductor light emitting devices. The anisotropic conductive layer is also formed between the wiring electrodes, and the light transmitting layer is formed on the anisotropic conductive layer formed between the wiring electrodes.

19 Claims, 10 Drawing Sheets

(56) References Cited

U.S. PATENT DOCUMENTS

| | | |
|---|---|---|
| 2012/0248495 A1* | 10/2012 | Umakoshi ............... H01L 33/60 |
| | | 257/E33.059 |
| 2013/0026476 A1 | 1/2013 | Park et al. |
| 2015/0249069 A1 | 9/2015 | Yoshida et al. |
| 2017/0062400 A1 | 3/2017 | Li et al. |
| 2017/0170151 A1 | 6/2017 | Rhee et al. |
| 2017/0345802 A1* | 11/2017 | Sung ....................... H01L 33/54 |
| 2017/0358624 A1 | 12/2017 | Takeya et al. |
| 2018/0076182 A1* | 3/2018 | Wu ..................... H01L 25/0753 |
| 2019/0181122 A1* | 6/2019 | Hsu ......................... H01L 33/62 |
| 2019/0348588 A1* | 11/2019 | Hsieh ...................... H01L 33/62 |

FOREIGN PATENT DOCUMENTS

| | | |
|---|---|---|
| KR | 10-2014-0030887 A | 3/2014 |
| KR | 10-2019-0057881 A | 5/2018 |
| KR | 10-2018-0114439 A | 10/2018 |
| KR | 10-2020-0006952 A | 1/2020 |
| WO | WO 2017/217703 A1 | 12/2017 |

* cited by examiner

[FIG. 1]
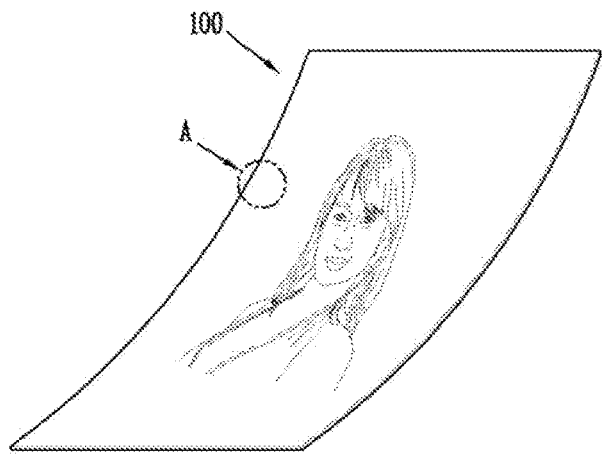
[FIG. 2]
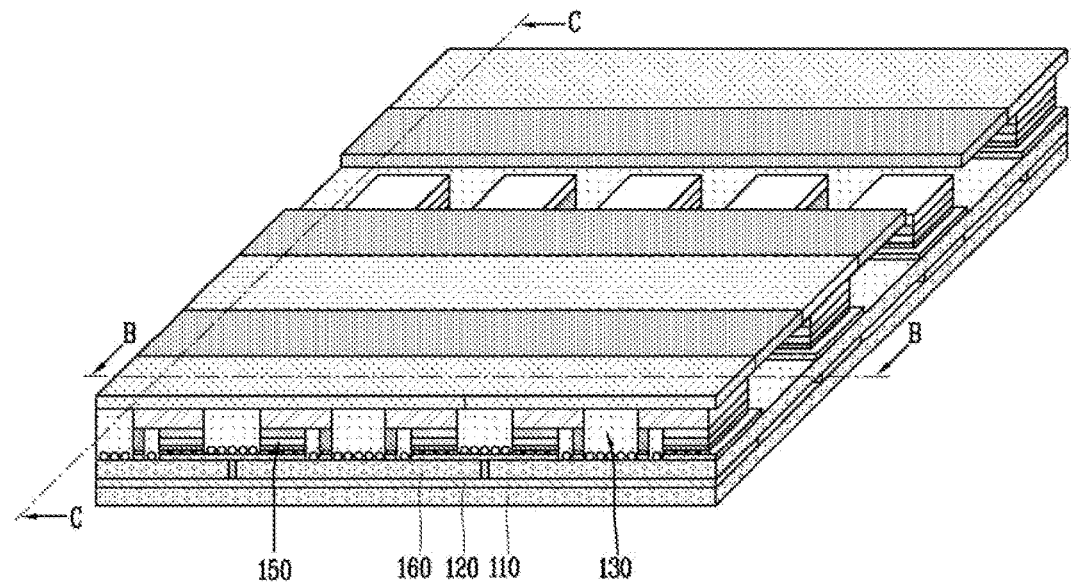

[FIG. 3a]
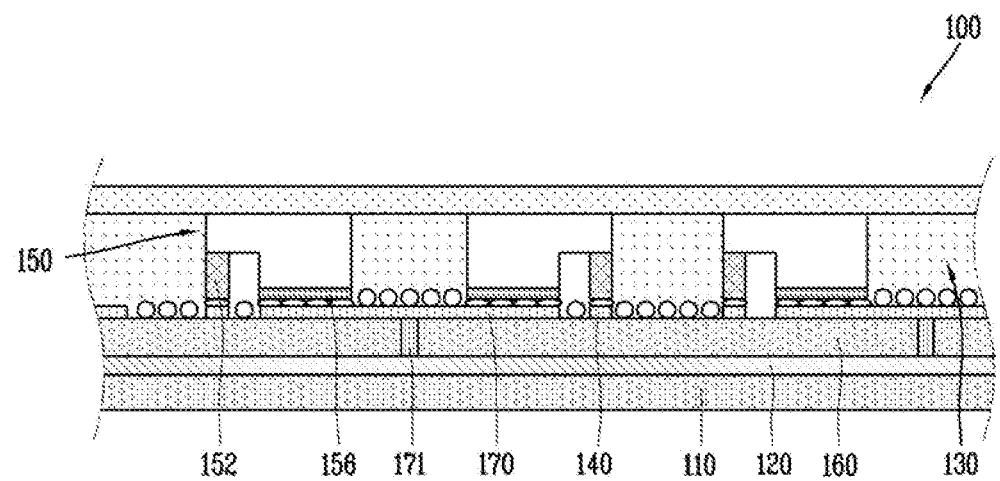
[FIG. 3b]
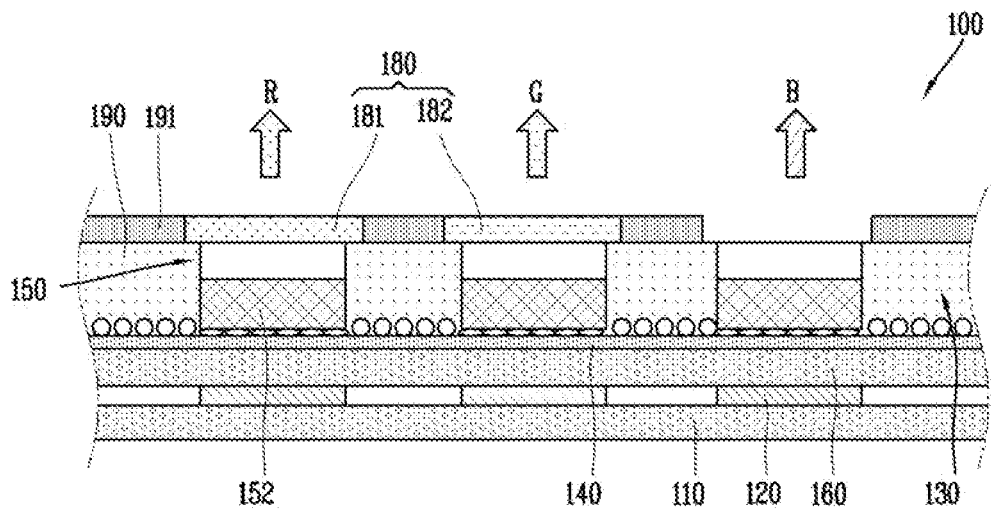

[FIG. 4]
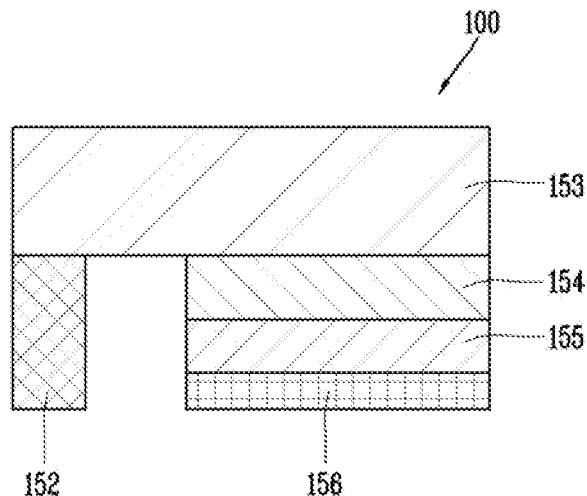
[FIG. 5a]
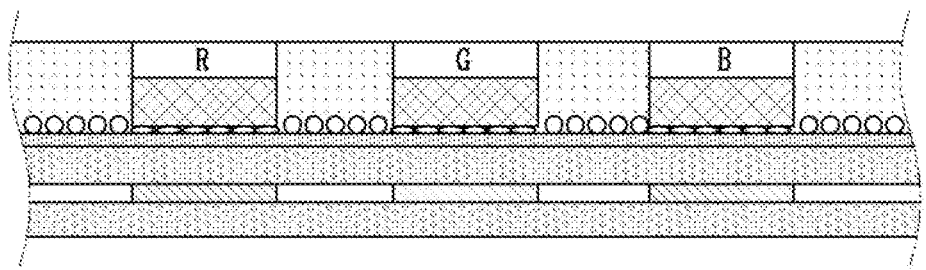
[FIG. 5b]
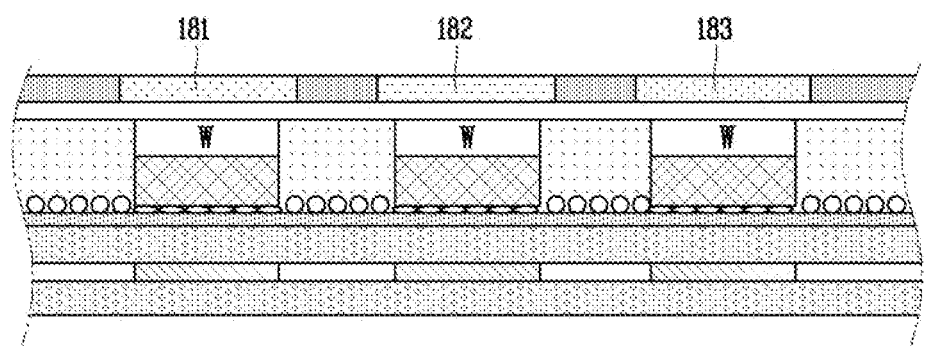

[FIG. 5c]
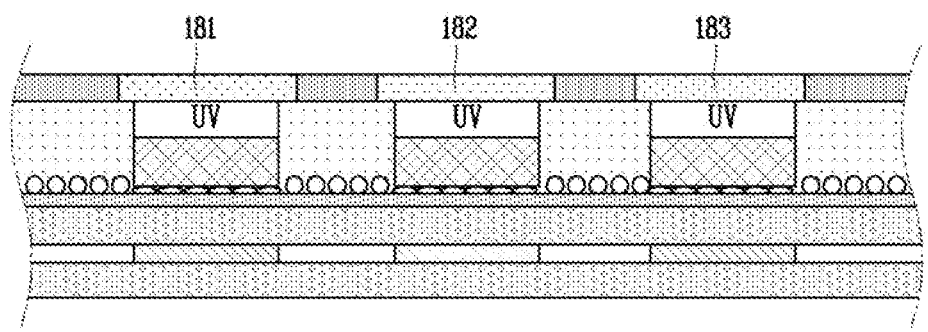

[FIG. 6]
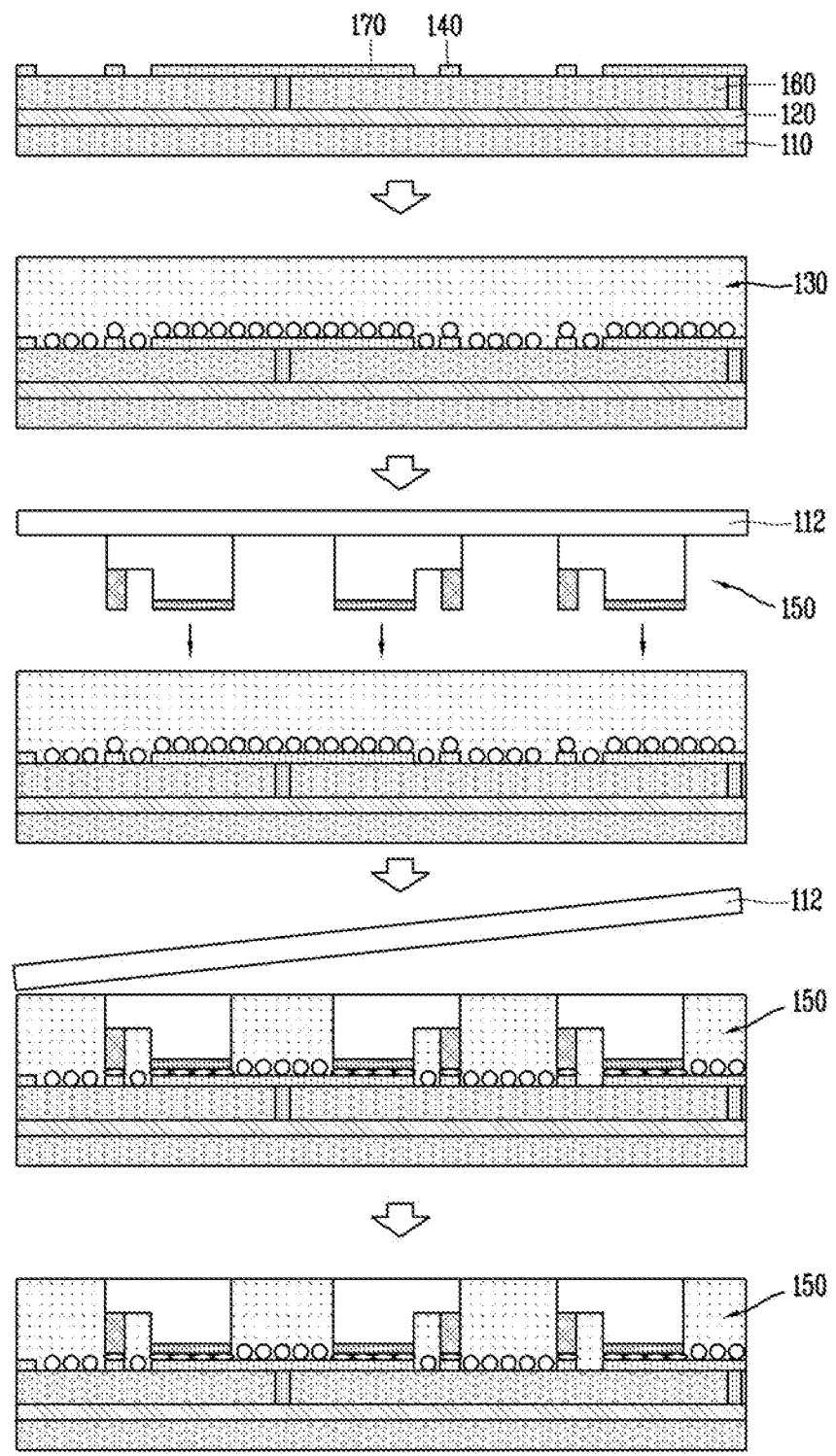

【FIG. 7】
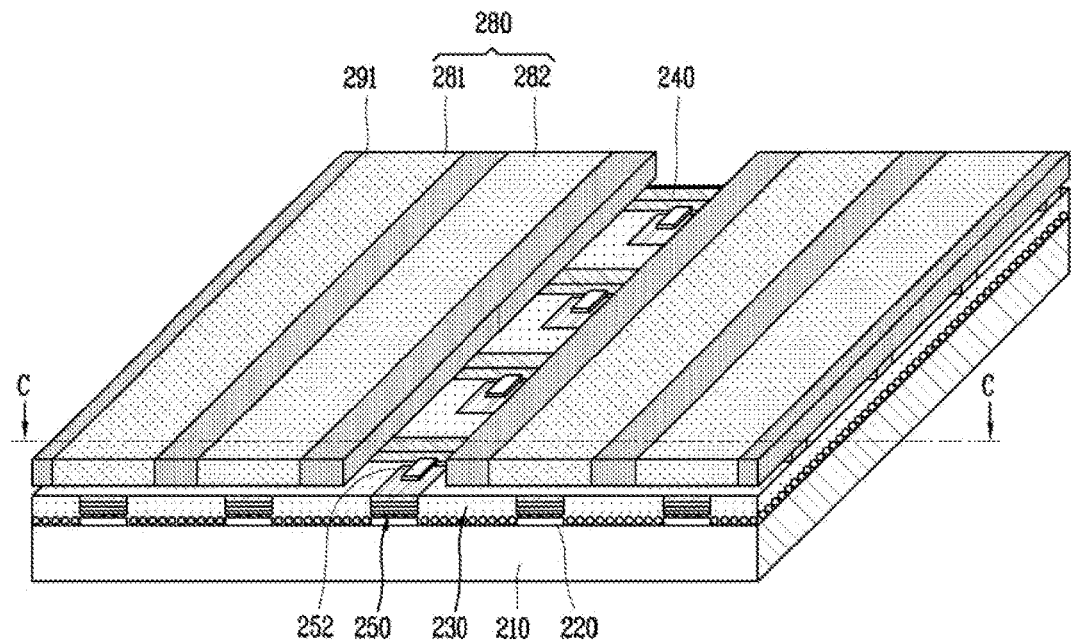
【FIG. 8】
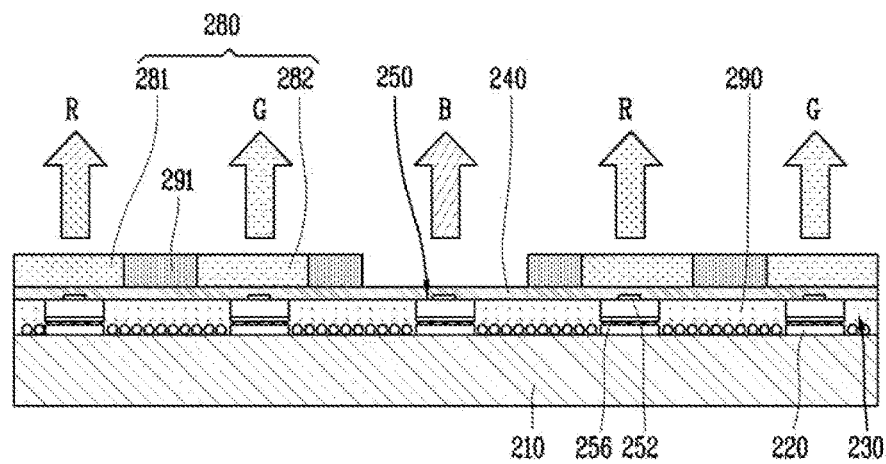

[FIG. 9]
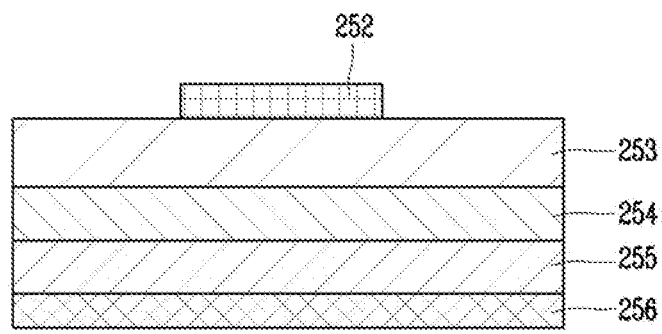
[FIG. 10]
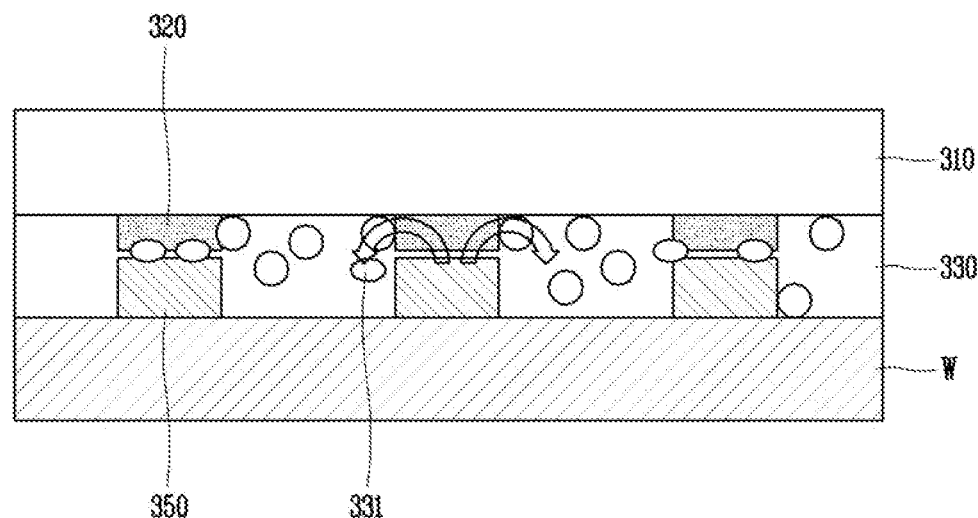
[FIG. 11]
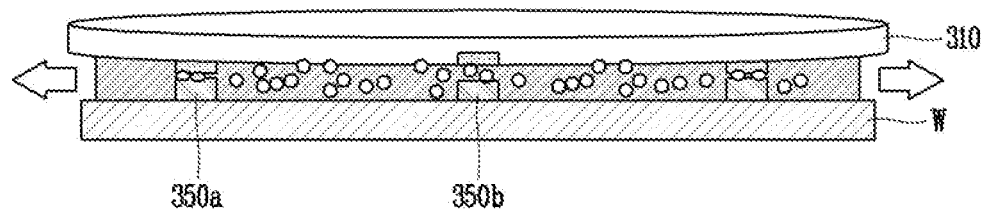

[FIG. 12]
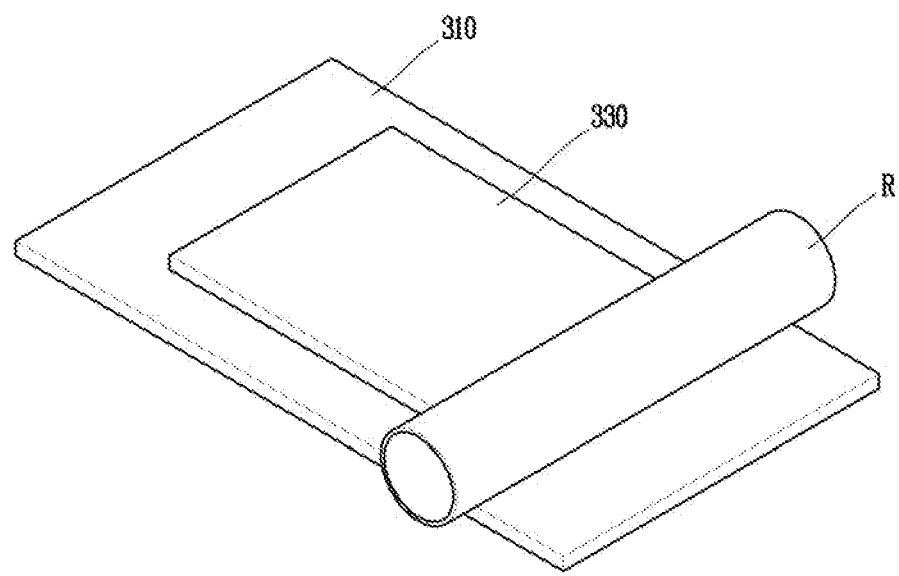
[FIG. 13]
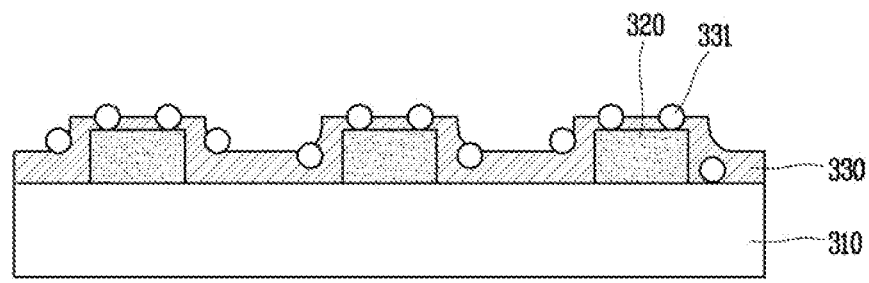

[FIG. 14]
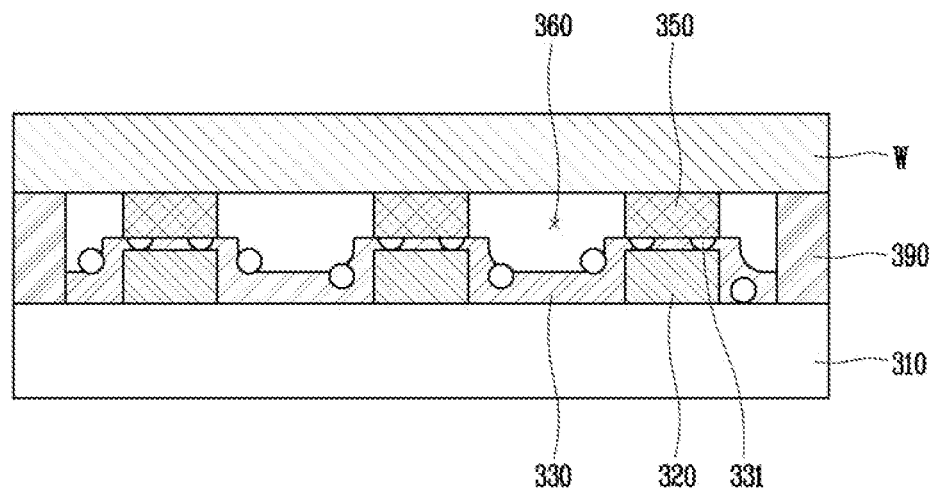
[FIG. 15]
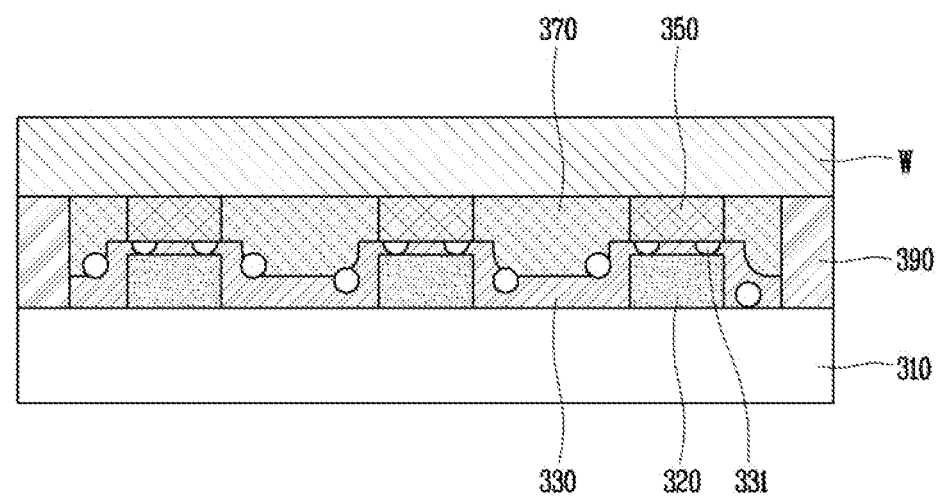

[FIG. 16]
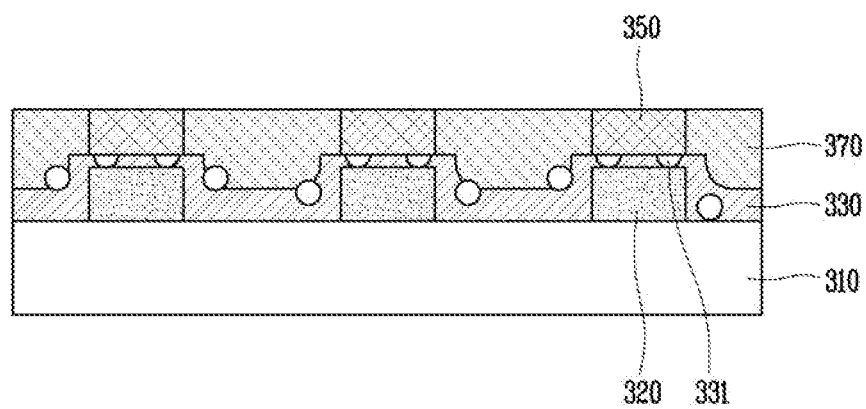

DISPLAY DEVICE USING A SEMICONDUCTOR LIGHT EMITTING DEVICE AND MANUFACTURING METHOD THEREOF

CROSS REFERENCE TO RELATED APPLICATIONS

This application is the National Phase of PCT International Application No. PCT/KR2020/002453, filed on Feb. 20, 2020, which claims priority under 35 U.S.C. 119 (a) to Patent Application No. 10-2019-0084033, filed in the Republic of Korea on Jul. 11, 2019, all of these applications are hereby expressly incorporated by reference into the present application.

TECHNICAL FIELD

The present invention relates to a display device and a method of manufacturing the same, and more particularly, to a flexible display device using a semiconductor light emitting device.

BACKGROUND ART

In recent years, in the field of display technology, a display device having excellent characteristics such as thin and flexible has been developed. On the other hand, the main commercial displays are represented by LCD (Liquid Crystal Display) and AMOLED (Active Matrix Organic Light Emitting Diodes).

Meanwhile, a light emitting diode (LED) is a well-known semiconductor light emitting device that converts current into light. As for LED, red LEDs using GaAsP compound semiconductors began to be commercialized in 1962. Since then, it has been used as a light source for display images in electronic devices including information communication devices along with GaP:N series green LEDs. Accordingly, a method of solving the above problem by implementing a flexible display using the semiconductor light emitting device may be proposed.

The semiconductor light emitting device is transferred onto the substrate in various ways. As one of the transfer methods of semiconductor light emitting devices, a transfer method using an anisotropic conductive layer is used. The use of an anisotropic conductive layer has the advantage of being able to electrically connect the semiconductor light emitting device and the wiring electrode only by thermal compression, but there is a problem in that contact failure between the semiconductor light emitting device and the wiring electrode occurs when the area of the wiring substrate is increased.

DISCLOSURE

Technical Problem

An object of the present invention is to provide a structure and manufacturing method for preventing the occurrence of contact failure between the semiconductor light emitting device and the wiring electrode when a semiconductor light emitting device is pressed to a wiring electrode using an anisotropic conductive layer.

Technical Solution

In order to achieve the above object, the present invention provides a substrate, a wiring electrode disposed on the substrate, a plurality of semiconductor light emitting devices electrically connected to the wiring electrode, and disposed between the semiconductor light emitting devices, and insulating conductive particles and an anisotropic conductive layer made of a mixture of materials and a light transmitting layer formed between the semiconductor light emitting devices, the anisotropic conductive layer is also formed between the wiring electrodes, and the light transmitting layer is formed on the anisotropic conductive layer formed between the wiring electrodes.

In an embodiment, the anisotropic conductive layer may include a first region formed on the wiring electrode and a second region formed between the wiring electrodes.

In an embodiment, the average thickness of the second region may be smaller than the thickness of the wiring electrode.

In one embodiment, the light transmitting layer may be formed to surround a side surface of the semiconductor light emitting device.

In an embodiment, a part of the light transmitting layer may protrude through the wiring electrodes.

In addition, the present invention provides a method of manufacturing a display device by transferring a plurality of semiconductor light emitting devices to a substrate on which a wiring electrode is formed. Specifically, the manufacturing method of the present invention includes coating and curing a resin containing conductive particles on the substrate, and aligning a transfer substrate on which a plurality of semiconductor light emitting devices are disposed on the substrate. In addition, the manufacturing method of the present invention includes compressing the transfer substrate onto the substrate, injecting a light transmitting resin into an empty space formed between the transfer substrate and the substrate and then curing, and removing the transfer substrate.

In an embodiment, the step of coating and curing the resin including the conductive particles on the substrate may be performed so that the coating layer is formed to have a thickness smaller than that of the wiring electrode.

In an embodiment, the step of injecting and curing a light transmitting resin into an empty space formed between the transfer substrate and the substrate may be performed after forming a sealing layer on the edge of the substrate.

Advantageous Effects

In the display device according to the present invention, since the flow of the anisotropic conductive layer is minimized when the semiconductor light emitting device is pressed onto the wiring substrate, it is possible to prevent the conductive particles from being separated between the semiconductor light emitting device and the wiring electrode. Through this, the present invention prevents the occurrence of contact failure between the semiconductor light emitting device and the wiring electrode.

Further, according to the present invention, when the semiconductor light emitting device is pressed onto the wiring substrate, the buffer unit can maintain a constant distance between the semiconductor light emitting device and the wiring electrode. Through this, even if the wiring substrate is widened, a uniform pressure can be applied to each of the semiconductor light emitting devices.

DESCRIPTION OF DRAWINGS

FIG. 1 is a conceptual diagram showing an embodiment of a display device using a semiconductor light emitting device of the present invention.

FIG. 2 is a partially enlarged view of portion A of FIG. 1, and FIGS. 3A and 3B are cross-sectional views taken along lines B-B and C-C of FIG. 2.

FIG. 4 is a conceptual diagram illustrating the flip chip type semiconductor light emitting device of FIG. 3.

FIGS. 5A to 5C are conceptual diagrams illustrating various forms of implementing colors in relation to a flip chip type semiconductor light emitting device.

FIG. 6 is a cross-sectional view showing a method of manufacturing a display device using the semiconductor light emitting device of the present invention.

FIG. 7 is a perspective view showing another embodiment of a display device using the semiconductor light emitting device of the present invention.

FIG. 8 is a cross-sectional view taken along the line D-D of FIG. 7.

FIG. 9 is a conceptual diagram illustrating the vertical semiconductor light emitting device of FIG. 8.

FIGS. 10 and 11 are conceptual diagrams illustrating a problem occurring during compression described in FIG. 6.

FIGS. 12 to 15 are conceptual diagrams illustrating a method of manufacturing a display device according to the present invention.

FIG. 16 is a cross-sectional view of a display device according to the present invention.

MODE FOR INVENTION

Hereinafter, exemplary embodiments disclosed in the present specification will be described in detail with reference to the accompanying drawings, but identical or similar elements are denoted by the same reference numerals regardless of reference numerals, and redundant descriptions thereof will be omitted. The suffixes "module" and "unit" for components used in the following description are given or used interchangeably in consideration of only the ease of preparation of the specification, and do not themselves have a distinct meaning or role. In addition, in describing the embodiments disclosed in the present specification, when it is determined that a detailed description of related known technologies may obscure the gist of the embodiments disclosed in the present specification, the detailed description thereof will be omitted. In addition, it should be noted that the accompanying drawings are for easy understanding of the embodiments disclosed in the present specification, and the technical spirit disclosed in the present specification is not to be construed as being limited by the accompanying drawings.

Also, when an element such as a layer, region or substrate is referred to as being "on" another component, it will be understood that it may exist directly on the other element or that intermediate elements may exist between them. There will be.

Display devices described herein include a mobile phone, a smart phone, a laptop computer, a digital broadcasting terminal, a personal digital assistant (PDA), a portable multimedia player (PMP), a navigation system, a Slate PC, Tablet PC, Ultra Book, digital TV, desktop computer, etc. However, it will be readily apparent to those skilled in the art that the configuration according to the embodiment described in the present specification may be applied to a device capable of displaying even if it is a new product type to be developed later.

FIG. 1 is a conceptual diagram showing an embodiment of a display device using a semiconductor light emitting device of the present invention.

As illustrated, information processed by the controller of the display apparatus 100 may be displayed using a flexible display.

Flexible displays include displays that can be bent, crooked, twistable, collapsible, and rollable by an external force. For example, the flexible display may be a display manufactured on a thin and flexible substrate that can be bent, twistable, foldable or rolled like paper while maintaining the display characteristics of a conventional flat panel display.

In a state in which the flexible display is not bent (for example, a state having an infinite radius of curvature, hereinafter referred to as a first state), the display area of the flexible display becomes a flat surface. In a state that is bent by an external force in the first state (for example, a state having a finite radius of curvature, hereinafter referred to as a second state), the display area may be a curved surface. As illustrated, the information displayed in the second state may be visual information output on a curved surface. This visual information is implemented by independently controlling light emission of sub-pixels arranged in a matrix form. The unit pixel means a minimum unit for implementing one color.

The unit pixel of the flexible display may be implemented by a semiconductor light emitting device. In the present invention, a light emitting diode (LED) is exemplified as a kind of semiconductor light emitting device that converts current into light. The light emitting diode is formed in a small size, and through this, it can serve as a unit pixel even in the second state.

Hereinafter, a flexible display implemented using the light emitting diode will be described in more detail with reference to the drawings.

FIG. 2 is a partially enlarged view of part A of FIG. 1, FIGS. 3A and 3B are cross-sectional views taken along lines BB and CC of FIG. 2, and FIG. 4 is a conceptual diagram illustrating the flip chip type semiconductor light emitting device of FIG. 3A. FIGS. 5A to 5C are conceptual diagrams illustrating various forms of implementing colors in relation to a flip chip type semiconductor light emitting device.

Refereeing to FIGS. 2, 3A, and 3B, a display device 100 using a passive matrix (PM) type semiconductor light emitting device is illustrated as a display device 100 using a semiconductor light emitting device. However, the example described below is applicable to an active matrix (AM) type semiconductor light emitting device.

The display device 100 includes a substrate 110, a first electrode 120, a conductive adhesive layer 130, a second electrode 140, and a plurality of semiconductor light emitting devices 150.

The substrate 110 may be a flexible substrate. For example, in order to implement a flexible display device, the substrate 110 may include glass or polyimide (PI). In addition, any material such as polyethylene naphthalate (PEN) and polyethylene terephthalate (PET) may be used as long as it is an insulating and flexible material. Further, the substrate 110 may be a transparent material or an opaque material.

The substrate 110 may be a wiring substrate on which the first electrode 120 is disposed, and thus the first electrode 120 may be positioned on the substrate 110.

As illustrated, the insulating layer 160 may be disposed on the substrate 110 on which the first electrode 120 is located, and the auxiliary electrode 170 may be disposed on the insulating layer 160. In this case, a state in which the insulating layer 160 is stacked on the substrate 110 may be a single wiring substrate. More specifically, the insulating layer 160 is made of an insulating and flexible material such as polyimide (PI), PET, and PEN, and may be formed integrally with the substrate 110 to form a single substrate.

The auxiliary electrode 170 is an electrode that electrically connects the first electrode 120 and the semiconductor light emitting device 150, and is positioned on the insulating layer 160 and is disposed corresponding to the position of the first electrode 120. For example, the auxiliary electrode 170 has a dot shape and may be electrically connected to the first electrode 120 by an electrode hole 171 penetrating the insulating layer 160. The electrode hole 171 may be formed by filling a via hole with a conductive material.

Referring to the drawings, a conductive adhesive layer 130 is formed on one surface of the insulating layer 160, but the present invention is not limited thereto. For example, a layer performing a specific function may be formed between the insulating layer 160 and the conductive adhesive layer 130. In addition, a structure in which the conductive adhesive layer 130 is disposed on the substrate 110 without the insulating layer 160 is also possible. In a structure in which the conductive adhesive layer 130 is disposed on the substrate 110, the conductive adhesive layer 130 may serve as an insulating layer.

The conductive adhesive layer 130 may be a layer having adhesiveness and conductivity, and for this purpose, a conductive material and a material having adhesiveness may be mixed in the conductive adhesive layer 130. In addition, the conductive adhesive layer 130 has ductility, thereby enabling a flexible function in the display device.

As such an example, the conductive adhesive layer 130 may be an anisotropic conductive film (ACF), an anisotropic conductive paste, a solution containing conductive particles, or the like. The conductive adhesive layer 130 allows electrical interconnection in the Z direction passing through the thickness, but may be configured as a layer having electrical insulation in the horizontal X-Y direction. Therefore, the conductive adhesive layer 130 may be referred to as a Z-axis conductive layer (however, hereinafter referred to as 'conductive adhesive layer').

The anisotropic conductive film is a film in which an anisotropic conductive medium is mixed with an insulating base member, and when heat and pressure are applied, only a specific portion becomes conductive by the anisotropic conductive medium. Hereinafter, it will be described that heat and pressure are applied to the anisotropic conductive film, but other methods are also possible in order for the anisotropic conductive film to partially have conductivity. Such a method may be, for example, the application of only one of the above heat and pressure, or UV curing or the like.

In addition, the anisotropic conductive medium may be, for example, conductive balls or conductive particles. As shown in the drawing, the anisotropic conductive film in this example is a film in which conductive balls are mixed with an insulating base member, and when heat and pressure are applied, only a specific portion becomes conductive by the conductive balls. In the anisotropic conductive film, a core of a conductive material may contain a plurality of particles covered by an insulating film made of a polymer material, and in this case, a portion to which heat and pressure are applied becomes conductive by the core as the insulating film is destroyed. At this time, the shape of the core may be deformed to form a layer in contact with each other in the thickness direction of the film. As a more specific example, heat and pressure are applied to the anisotropic conductive film as a whole, and an electrical connection in the Z-axis direction is partially formed due to a height difference of a counterpart adhered by the anisotropic conductive film.

As another example, the anisotropic conductive film may be in a state in which a plurality of particles coated with a conductive material are contained in an insulating core. In this case, the part to which heat and pressure are applied is deformed (pressed together) to have conductivity in the thickness direction of the film. As another example, a form in which the conductive material penetrates the insulating base member in the Z-axis direction and has conductivity in the thickness direction of the film is also possible. In this case, the conductive material may have a pointed end.

As shown in the drawing, the anisotropic conductive film may be a fixed array anisotropic conductive film (ACF) in which conductive balls are inserted into one surface of an insulating base member. More specifically, the insulating base member is formed of an adhesive material, and the conductive ball is intensively disposed on the bottom portion of the insulating base member, and when heat and pressure are applied from the base member, it is deformed together with the conductive ball. Accordingly, it has conductivity in the vertical direction.

However, the present invention is not necessarily limited thereto, and the anisotropic conductive film has a form in which conductive balls are randomly mixed in an insulating base member, or consists of a plurality of layers, and a form in which conductive balls are disposed on one layer (double-ACF) etc. are all possible.

The anisotropic conductive paste is a combination of a paste and a conductive ball, and may be a paste in which conductive balls are mixed with an insulating and adhesive base material. In addition, the solution containing conductive particles may be a solution containing conductive particles or nano particles.

Referring back to the drawings, the second electrode 140 is positioned on the insulating layer 160 to be spaced apart from the auxiliary electrode 170. That is, the conductive adhesive layer 130 is disposed on the insulating layer 160 on which the auxiliary electrode 170 and the second electrode 140 are located.

After forming the conductive adhesive layer 130 with the auxiliary electrode 170 and the second electrode 140 positioned on the insulating layer 160, the semiconductor light emitting device 150 is connected in a flip chip form by applying heat and pressure. Then, the semiconductor light emitting device 150 is electrically connected to the first electrode 120 and the second electrode 140.

Referring to FIG. 4, the semiconductor light emitting device may be a flip chip type light emitting device.

For example, the semiconductor light emitting device includes a p-type electrode 156, a p-type semiconductor layer 155 on which the p-type electrode 156 is formed, an active layer 154 formed on the p-type semiconductor layer 155, an n-type semiconductor layer 153 formed on the active layer 154, an n-type electrode 152 disposed horizontally apart from the p-type electrode 156 on the n-type semiconductor layer 153. In this case, the p-type electrode 156 may be electrically connected to the auxiliary electrode 170 and the conductive adhesive layer 130, and the n-type electrode 152 may be electrically connected to the second electrode 140.

Referring back to FIGS. 2, 3A, and 3B, the auxiliary electrode 170 is formed to be elongated in one direction, so that one auxiliary electrode may be electrically connected to the plurality of semiconductor light emitting devices 150. For example, the p-type electrodes of the left and right semiconductor light emitting devices with the auxiliary electrode as the center may be electrically connected to one auxiliary electrode.

More specifically, the semiconductor light emitting device 150 is pressed into the conductive adhesive layer 130 by heat and pressure. Through this, only the portion between the p-type electrode 156 and the auxiliary electrode 170 of the semiconductor light emitting device 150 and the portion between the n-type electrode 152 and the second electrode 140 of the semiconductor light emitting device 150 becomes conductive. In the rest of the part, there is no press-fitting of the semiconductor light emitting device, so it does not have conductivity. In this way, the conductive adhesive layer 130 not only mutually couples the semiconductor light emitting device 150 and the auxiliary electrode 170, and the semiconductor light emitting device 150 and the second electrode 140 respectively, but also forms an electrical connection.

Further, the plurality of semiconductor light emitting devices 150 constitute a light emitting device array, and a phosphor layer 180 is formed in the light emitting device array.

The light emitting device array may include a plurality of semiconductor light emitting devices having different luminance values. Each semiconductor light emitting device 150 constitutes a unit pixel, and is electrically connected to the first electrode 120. For example, there may be a plurality of first electrodes 120, semiconductor light emitting devices are arranged in rows, for example, and semiconductor light emitting devices in each row may be electrically connected to any one of the plurality of first electrodes.

In addition, since the semiconductor light emitting devices are connected in a flip chip form, semiconductor light emitting devices grown on a transparent dielectric substrate can be used. Further, the semiconductor light emitting devices may be, for example, nitride semiconductor light emitting devices. Since the semiconductor light emitting device 150 has excellent luminance, individual unit pixels can be configured with a small size.

As illustrated, a partition wall 190 may be formed between the semiconductor light emitting devices 150. In this case, the partition wall 190 may serve to separate individual unit pixels from each other, and may be integrally formed with the conductive adhesive layer 130. For example, when the semiconductor light emitting device 150 is inserted into the anisotropic conductive film, the base member of the anisotropic conductive film may form the partition wall.

In addition, if the base member of the anisotropic conductive film is black, the partition wall 190 may have reflective properties and a contrast ratio may be increased even without a separate black insulator.

As another example, a reflective partition wall may be separately provided as the partition wall 190. In this case, the partition wall 190 may include a black or white insulator depending on the purpose of the display device. When a partition wall of a white insulator is used, it is possible to increase reflectivity, and when a partition wall of a black insulator is used, it is possible to increase the contrast while having reflective characteristics.

The phosphor layer 180 may be located on the outer surface of the semiconductor light emitting device 150. For example, the semiconductor light emitting device 150 is a blue semiconductor light emitting device that emits blue (B) light, and the phosphor layer 180 performs a function of converting the blue (B) light into a color of a unit pixel. The phosphor layer 180 may be a red phosphor 181 or a green phosphor 182 constituting individual pixels.

That is, at a position forming a red unit pixel, a red phosphor 181 capable of converting blue light into red (R) light may be stacked on the blue semiconductor light emitting device 151, and at a position forming the green unit pixel, a green phosphor 182 capable of converting blue light into green (G) light may be stacked on the blue semiconductor light emitting device 151. In addition, only the blue semiconductor light emitting device 151 may be used alone in a portion of the blue unit pixel. In this case, unit pixels of red (R), green (G), and blue (B) may form one pixel. More specifically, a phosphor of one color may be stacked along each line of the first electrode 120. Accordingly, one line in the first electrode 120 may be an electrode that controls one color. That is, along the second electrode 140, red (R), green (G), and blue (B) may be sequentially disposed, and a unit pixel may be implemented through this.

However, the present invention is not necessarily limited thereto, and unit pixels of red (R), green (G), and blue (B) may be implemented by combining the semiconductor light emitting device 150 and the quantum dot (QD) instead of the phosphor.

In addition, a black matrix 191 may be disposed between each of the phosphor layers in order to improve contrast. That is, the black matrix 191 can improve contrast of the contrast.

However, the present invention is not necessarily limited thereto, and other structures for implementing blue, red, and green colors may be applied.

Referring to FIG. 5A, each semiconductor light emitting device 150 mainly uses gallium nitride (GaN), and indium (In) and/or aluminum (Al) may be added together, thereby emitting various lights including blue such that it may be implemented as a high-power light-emitting device that emits light.

In this case, the semiconductor light emitting device 150 may be a red, green, and blue semiconductor light emitting device to form a sub-pixel, respectively. For example, red, green, and blue semiconductor light emitting devices (R, G, B) are alternately arranged, and unit pixels of red, green, and blue by red, green, and blue semiconductor light emitting devices form one pixel, through which a full color display can be implemented.

Referring to FIG. 5B, the semiconductor light emitting device may include a white light emitting device Win which a yellow phosphor layer is provided for each individual device. In this case, to form a unit pixel, a red phosphor layer 181, a green phosphor layer 182, and a blue phosphor layer 183 may be provided on the white light emitting device W. In addition, a unit pixel may be formed on the white light emitting device W by using a color filter in which red, green, and blue are repeated.

Referring to FIG. 5C, a structure in which a red phosphor layer 181, a green phosphor layer 182, and a blue phosphor layer 183 are provided on the ultraviolet light emitting device UV is also possible. In this way, the semiconductor light emitting device can be used not only in visible light but also in the ultraviolet (UV) region, and the ultraviolet (UV) can be extended in the form of a semiconductor light emitting device that can be used as an excitation source of the upper phosphor.

Referring to again this embodiment, the semiconductor light emitting device 150 is positioned on the conductive adhesive layer 130 to configure a unit pixel in the display device. Since the semiconductor light emitting device 150 has excellent luminance, individual unit pixels can be configured with a small size. The individual semiconductor light emitting device 150 may have a side length of 80 μm or less, and may be a rectangular or square device. In the case of a rectangle, the size may be 20×80 μm or less.

In addition, even when the square semiconductor light emitting device 150 having a side length of 10 µm is used as a unit pixel, sufficient brightness to form a display device is exhibited. Accordingly, for example, when the size of the unit pixel is a rectangular pixel having one side of 600 µm and the other side of 300 µm, the distance between the semiconductor light emitting devices is relatively large enough. Therefore, in this case, it is possible to implement a flexible display device having HD image quality.

The display device using the semiconductor light emitting device described above can be manufactured by a new type of manufacturing method. Hereinafter, the manufacturing method will be described with reference to FIG. 6.

FIG. 6 is a cross-sectional view showing a method of manufacturing a display device using the semiconductor light emitting device of the present invention.

Referring to this drawing, firstly, a conductive adhesive layer 130 is formed on the insulating layer 160 on which the auxiliary electrode 170 and the second electrode 140 are positioned. An insulating layer 160 is stacked on the first substrate 110 to form one substrate (or wiring substrate), and the first electrode 120, the auxiliary electrode 170, and the second electrode 140 are disposed on the wiring substrate. In this case, the first electrode 120 and the second electrode 140 may be disposed in a mutually orthogonal direction. In addition, in order to implement a flexible display device, the first substrate 110 and the insulating layer 160 may each include glass or polyimide (PI).

The conductive adhesive layer 130 may be implemented by, for example, an anisotropic conductive film, and for this purpose, an anisotropic conductive film may be applied to a substrate on which the insulating layer 160 is positioned.

Next, a plurality of semiconductor light emitting devices 150 corresponding to positions of the auxiliary electrodes 170 and the second electrodes 140 and constituting individual pixels are positioned on the second substrate 112. The semiconductor light emitting device 150 of the second substrate 112 is disposed to face the auxiliary electrode 170 and the second electrode 140.

In this case, the second substrate 112 is a growth substrate on which the semiconductor light emitting device 150 is grown, and may be a sapphire substrate or a silicon substrate.

When the semiconductor light emitting device is formed in a wafer unit, it can be effectively used in a display device by having a gap and a size capable of forming a display device.

Then, the wiring substrate and the second board 112 are thermally compressed. For example, the wiring substrate and the second board 112 may be thermo-compressed bonded by applying an ACF press head. The wiring substrate and the second board 112 are bonded by the thermal compression bonding. Due to the property of the anisotropic conductive film having conductivity by thermocompression bonding, only the portion between the semiconductor light emitting device 150 and the auxiliary electrode 170 and the second electrode 140 has conductivity, through which electrodes and semiconductor light emitting device 150 may be electrically connected. At this time, the semiconductor light emitting device 150 is inserted into the anisotropic conductive film, and a partition wall may be formed between the semiconductor light emitting devices 150 through this.

Then, the second substrate 112 is removed. For example, the second substrate 112 may be removed using a laser lift-off method (LLO) or a chemical lift-off method (CLO).

Finally, the second substrate 112 is removed to expose the semiconductor light emitting devices 150 to the outside. If necessary, a transparent insulating layer (not shown) may be formed by coating silicon oxide (SiOx) or the like on the wiring substrate to which the semiconductor light emitting device 150 is bonded.

In addition, the step of forming a phosphor layer on one surface of the semiconductor light emitting device 150 may be further included. For example, when the semiconductor light emitting device 150 is a blue semiconductor light emitting device that emits blue (B) light, a red phosphor or a green phosphor for converting the blue (B) light into the color of a unit pixel emits the blue semiconductor light can be arranged in the form of a layer on one side of the device.

The manufacturing method or structure of a display device using the semiconductor light emitting device described above may be modified in various forms. As an example, a vertical semiconductor light emitting device may also be applied to the display device described above. Hereinafter, a vertical structure will be described with reference to FIGS. 5 and 6.

In addition, in the modified examples or embodiments described below, the same or similar reference numerals are assigned to the same or similar configurations as the previous examples, and the description can be replaced with the first description.

FIG. 7 is a perspective view showing another embodiment of a display device using the semiconductor light emitting device of the present invention, FIG. 8 is a cross-sectional view taken along the line DD of FIG. 7, and FIG. 9 is a conceptual diagram showing the vertical semiconductor light emitting device of FIG. 8.

Referring to the drawings, the display device may be a display device using a passive matrix (PM) type vertical semiconductor light emitting device.

The display device includes a substrate 210, a first electrode 220, a conductive adhesive layer 230, a second electrode 240, and a plurality of semiconductor light emitting devices 250.

The substrate 210 can be a wiring substrate on which the first electrode 220 is disposed, and may include polyimide (PI) to implement a flexible display device. In addition, any material that has insulation and is flexible may be used.

The first electrode 220 is positioned on the substrate 210 and may be formed as a bar-shaped electrode in one direction. The first electrode 220 may be formed to serve as a data electrode.

The conductive adhesive layer 230 is formed on the substrate 210 on which the first electrode 220 is located. Like a display device to which a flip chip type light emitting device is applied, the conductive adhesive layer 230 can be formed of an anisotropic conductive film (ACF), an anisotropic conductive paste, or a solution containing conductive particles. However, the present embodiment also illustrates a case in which the conductive adhesive layer 230 is implemented by an anisotropic conductive film.

After the anisotropic conductive film is positioned on the substrate 210 with the first electrode 220 positioned, the semiconductor light emitting device 250 is connected by applying heat and pressure to the semiconductor light emitting device 250. It is electrically connected to the first electrode 220. In this case, the semiconductor light emitting device 250 is preferably disposed to be positioned on the first electrode 220.

As described above, the electrical connection is created because the anisotropic conductive film partially has conductivity in the thickness direction when heat and pressure are applied. Therefore, in the anisotropic conductive film, it is divided into a part having conductivity and a part having non-conductivity in the thickness direction.

In addition, since the anisotropic conductive film contains an adhesive component, the conductive adhesive layer 230 implements electrical connection as well as mechanical coupling between the semiconductor light emitting device 250 and the first electrode 220.

In this way, the semiconductor light emitting device 250 is positioned on the conductive adhesive layer 230, thereby configuring individual pixels in the display device. Since the semiconductor light emitting device 250 has excellent luminance, individual unit pixels can be configured with a small size. The individual semiconductor light emitting device 250 may have a side length of 80 µm or less, and may be a rectangular or square device. In the case of a rectangle, the size may be 20×80 µm or less.

The semiconductor light emitting device 250 may have a vertical structure.

A plurality of second electrodes 240 are disposed between the vertical semiconductor light emitting devices in a direction crossing the length direction of the first electrode 220 and electrically connected to the vertical semiconductor light emitting device 250.

Referring to FIG. 9, the vertical semiconductor light emitting device includes a p-type electrode 256, a p-type semiconductor layer 255 formed on the p-type electrode 256, and an active layer 254 formed on the p-type semiconductor layer 255, an n-type semiconductor layer 253 formed on the active layer 254 and an n-type electrode 252 formed on the n-type semiconductor layer 253. In this case, the p-type electrode 256 located below may be electrically connected to the first electrode 220 and the conductive adhesive layer 230. The n-type electrode 252 located at the top may be electrically connected to the second electrode 240 to be described later. The vertical semiconductor light emitting device 250 has a great advantage of reducing a chip size because electrodes can be arranged up and down.

Referring back to FIG. 8, a phosphor layer 280 may be formed on one surface of the semiconductor light emitting device 250. For example, the semiconductor light emitting device 250 is a blue semiconductor light emitting device 251 that emits blue (B) light, and a phosphor layer 280 for converting the blue (B) light into a color of a unit pixel can be provided. In this case, the phosphor layer 280 may be a red phosphor 281 and a green phosphor 282 constituting individual pixels.

That is, at a position forming a red unit pixel, a red phosphor 281 capable of converting blue light into red (R) light may be stacked on the blue semiconductor light emitting device 251, and a position forming the green unit pixel, a green phosphor 282 capable of converting blue light into green (G) light may be stacked on the blue semiconductor light emitting device 251. Also, only the blue semiconductor light emitting device 251 may be used alone in a portion constituting the blue unit pixel. In this case, unit pixels of red (R), green (G), and blue (B) may form one pixel.

However, the present invention is not necessarily limited thereto, and other structures for implementing blue, red, and green colors may be applied as described above in a display device to which a flip chip type light emitting device is applied.

Referring back to the present embodiment, the second electrode 240 is positioned between the semiconductor light emitting devices 250 and is electrically connected to the semiconductor light emitting devices 250. For example, the semiconductor light emitting devices 250 may be arranged in a plurality of rows, and the second electrode 240 may be located between the rows of the semiconductor light emitting devices 250.

Since the distance between the semiconductor light emitting devices 250 constituting individual pixels is sufficiently large, the second electrode 240 may be positioned between the semiconductor light emitting devices 250.

The second electrode 240 may be formed as a long bar-shaped electrode in one direction, and may be disposed in a direction perpendicular to the first electrode.

In addition, the second electrode 240 and the semiconductor light emitting device 250 may be electrically connected by a connection electrode protruding from the second electrode 240. More specifically, the connection electrode may be an n-type electrode of the semiconductor light emitting device 250. For example, the n-type electrode is formed as an ohmic electrode for ohmic contact, and the second electrode covers at least a portion of the ohmic electrode by printing or deposition. Through this, the second electrode 240 and the n-type electrode of the semiconductor light emitting device 250 may be electrically connected.

As illustrated, the second electrode 240 may be positioned on the conductive adhesive layer 230. In some cases, a transparent insulating layer (not shown) including silicon oxide (SiOx) or the like may be formed on the substrate 210 on which the semiconductor light emitting device 250 is formed. When the second electrode 240 is positioned after the transparent insulating layer is formed, the second electrode 240 is positioned on the transparent insulating layer. In addition, the second electrode 240 may be formed to be spaced apart from the conductive adhesive layer 230 or the transparent insulating layer.

If a transparent electrode such as ITO (Indium Tin Oxide) is used to position the second electrode 240 on the semiconductor light emitting device 250, the ITO material has poor adhesion to the n-type semiconductor layer. Accordingly, according to the present invention, since the second electrode 240 is positioned between the semiconductor light emitting devices 250, there is an advantage that a transparent electrode such as ITO is not required. Therefore, the light extraction efficiency can be improved by using an n-type semiconductor layer and a conductive material having good adhesion as a horizontal electrode without being restricted by the selection of a transparent material.

As illustrated, a partition wall 290 may be positioned between the semiconductor light emitting devices 250. That is, a partition wall 290 may be disposed between the vertical semiconductor light emitting devices 250 to isolate the semiconductor light emitting devices 250 constituting individual pixels. In this case, the partition wall 290 may serve to separate individual unit pixels from each other, and may be integrally formed with the conductive adhesive layer 230. For example, when the semiconductor light emitting device 250 is inserted into the anisotropic conductive film, the base member of the anisotropic conductive film may form the partition wall.

In addition, if the base member of the anisotropic conductive film is black, the partition wall 290 may have reflective properties and a contrast ratio may be increased even without a separate black insulator.

As another example, as the partition wall 190, a reflective partition wall may be separately provided. The partition wall 290 may include a black or white insulator depending on the purpose of the display device.

If the second electrode 240 is directly positioned on the conductive adhesive layer 230 between the semiconductor light emitting elements 250, the partition wall 290 can be located between the vertical semiconductor light emitting element 250 and the second electrode 240. Accordingly, individual unit pixels can be configured with a small size using the semiconductor light emitting device 250. In addition, since the distance between the semiconductor light emitting elements 250 is relatively large enough, the second electrode 240 can be positioned between the semiconductor light emitting elements 250, and there is an effect of implementing a flexible display device having HD image quality.

In addition, according to the illustration, a black matrix 291 may be disposed between each phosphor in order to improve contrast. That is, the black matrix 291 can improve contrast of the contrast.

As described above, the semiconductor light emitting device 250 is positioned on the conductive adhesive layer 230, thereby configuring individual pixels in the display device. Since the semiconductor light emitting device 250 has excellent luminance, individual unit pixels can be configured with a small size. Accordingly, a full color display in which red (R), green (G), and blue (B) unit pixels form one pixel may be implemented by the semiconductor light emitting device.

Anisotropic conductive film (ACF) is used in the display device described above. The anisotropic conductive film (hereinafter, anisotropic conductive layer) is made of a mixture of conductive balls (hereinafter, conductive particles) and an insulating material. As described with reference to FIG. 6, when the substrate on which the semiconductor light emitting device is formed is thermally pressed onto the wiring substrate coated with the anisotropic conductive layer, the wiring electrode and the semiconductor light emitting device are electrically connected by conductive particles.

During thermal compression, the conductive particles are compressed between the semiconductor light emitting device and the wiring electrode to electrically connect the semiconductor light emitting device and the wiring electrode. In order for the semiconductor light emitting device and the wiring electrode to be electrically connected, a certain level of pressure or more must be applied to the conductive particles.

Referring to FIG. 10, during thermal compression, due to the fluidity of the anisotropic conductive layer 330, a contact failure between the semiconductor light emitting device 350 and the wiring electrode 320 may occur. Specifically, during thermal compression, the conductive particles 331 should be located between the semiconductor light emitting device 350 and the wiring electrode 320, but due to external pressure, the conductive particles 331 are formed between the semiconductor light emitting device 350 and the wiring electrode 320 can move without staying in therebetween. In this case, the semiconductor light emitting device 350 and the wiring electrode 320 are incompletely electrically connected.

On the other hand, referring to FIG. 11, as the area of the wiring substrate 310 increases, the pressure applied to each region of the wiring substrate 110 during thermal compression becomes non-uniform. Specifically, when the area of the wiring substrate is large, a relatively high pressure is applied to the edge area of the wiring substrate, and a relatively low pressure is applied to the central area of the wiring substrate. Due to this, the conductive particles are completely compressed to the wiring electrode and the semiconductor light emitting device in the edge area of the wiring substrate, but insufficient pressure is applied to the conductive particles in the central area of the wiring substrate, resulting in poor contact between the wiring electrode and the semiconductor light emitting device.

The present invention provides a structure and a manufacturing method that prevents conductive particles from being separated between a semiconductor light emitting device and a wiring electrode during the above-described thermal compression, and uniform pressure can be applied to the entire wiring substrate.

First, a method of manufacturing a display device according to the present invention will be described.

FIGS. 12 to 15 are conceptual diagrams illustrating a method of manufacturing a display device according to the present invention.

First, a step of curing after coating a resin including conductive particles 331 on the substrate 310 is performed. As shown in FIG. 12, the step of coating the resin including the conductive particles may be performed in a roll pressing method (R), but is not limited thereto.

The coating method may be performed by bar coating, beta coating, or the like. The coating method may vary depending on the distance between the wiring electrodes, the type of conductive particles, and the shape density.

When performing the above step, as shown in FIG. 13, an anisotropic conductive layer is formed between the wiring electrode and the wiring electrode. In the present specification, the anisotropic conductive layer is divided into a first region formed on the wiring electrode and a second region formed between the wiring electrodes.

It is preferable that the thickness of the anisotropic conductive layer 330 is minimized to the extent that conductive particles are formed in only one layer. Specifically, it is preferable that the average thickness of the second region is smaller than the thickness of the wiring electrode.

For example, the thickness of the anisotropic conductive layer 330 may be formed within 3 μm. However, the thickness of the anisotropic conductive layer 330 may vary depending on the size of the conductive particles.

When the average thickness of the second region decreases, the possibility of the conductive particles included in the first region moving to the second region decreases. Through this, the present invention minimizes a phenomenon in which conductive particles are separated from the area between the semiconductor light emitting device and the wiring electrode when the transfer substrate is pressed.

Next, referring to FIG. 14, a step of aligning a transfer substrate W on which a plurality of semiconductor light emitting devices 350 are disposed on the substrate 310 and a step of compressing the transfer substrate W to the top of the substrate 310 are sequentially in progress.

When the semiconductor light emitting device 350 formed on the wafer is directly transferred to the wiring substrate, the wafer itself may be the transfer substrate W. In contrast, when a semiconductor light emitting device formed on a wafer is primarily transferred to an intermediate substrate and then transferred to a wiring substrate, the intermediate substrate becomes a transfer substrate.

Since the anisotropic conductive layer 330 according to the present invention is formed to have a very thin thickness, the anisotropic conductive layer 330 does not flow much during the pressing process. In the pressing step, a part of the anisotropic conductive layer 330 may flow, but since most of the spaces between the semiconductor light emitting devices 350 and the wiring electrodes 320 are empty spaces 360, the anisotropic conductive layer 330 flows into the empty space. Through this, the present invention allows the pressure to be uniformly applied to the entire area of the substrate 310 during the pressing process.

In the pressing step, the conductive particles 331 are compressed to electrically connect the semiconductor light emitting device 350 and the wiring electrode 320. According to the present invention, since the flow of the anisotropic conductive layer 330 is minimized, the possibility that the conductive particles 331 deviate from the position between the semiconductor light emitting device 350 and the wiring electrode 320 in the pressing step lowers.

Next, referring to FIG. 15, a step of injecting and curing a light transmitting resin into an empty space 360 formed between the transfer substrate W and the substrate 310 is performed.

As a result of the pressing step, an empty space 360 is formed between the transfer substrate W and the substrate 310. For planarization, a light transmitting resin is put into the empty space 360. The light transmitting resin 370 complements the fixing ability of the anisotropic conductive layer 330 which is reduced by decreasing the thickness of the anisotropic conductive layer 330. Specifically, the anisotropic conductive layer 330 having a reduced thickness may not sufficiently fix the semiconductor light emitting device 350 compressed to the wiring electrode. The light transmitting resin 370 serves to strongly fix the semiconductor light-emitting device 350 to the substrate 310 from the side of the semiconductor light-emitting device 350. Through this, the present invention prevents the semiconductor light emitting device from being separated from the substrate 310 even if the thickness of the anisotropic conductive layer 330 is reduced.

Meanwhile, in the step of injecting and curing the light transmitting resin 370 into the empty space 360, a sealing layer 390 may be formed on the edge of the substrate to prevent the resin from leaking to the outside.

The sealing layer 390 is disposed between the substrate 310 and the transfer substrate W, and prevents resin from leaking out from the edge of the substrate 310. In the step of injecting the light transmitting resin into the empty space 360 and then curing the transfer substrate W, the height of the light transmitting resin layer 370 is limited to a certain level. Accordingly, the height of the semiconductor light emitting device 350 becomes the same as the height of the light transmitting resin layer 370. For this reason, the present invention does not require a separate planarization process after transfer of the semiconductor light emitting device.

Finally, the step of removing the transfer substrate W proceeds. The transfer substrate may be removed by a laser lift-off (LLO) method, but is not limited thereto.

Hereinafter, a display device manufactured by the above-described method will be described with reference to FIG. 16.

FIG. 16 is a cross-sectional view of a display device according to the present invention.

Referring to FIG. 16, conductive particles 331 positioned between the semiconductor light emitting device 350 and the wiring electrode 320 electrically connect the semiconductor light emitting device 350 and the wiring electrode 320 in a compressed state.

The light transmitting layer 370 is formed on the anisotropic conductive layer 330 formed between the wiring electrodes 320. That is, the light transmitting layer 370 is formed on the second region of the anisotropic conductive layer 330.

Meanwhile, the average thickness of the second region may be smaller than the thickness of the wiring electrode 320. The light transmitting layer 370 may be formed not only to surround a side surface of the semiconductor light emitting device, but also to partially protrude through the wiring electrodes.

The display device using the semiconductor light emitting device described above is not limited to the configuration and method of the above-described embodiments, and the above embodiments are configured by selectively combining all or part of each of the embodiments so that various modifications can be made.

The invention claimed is:

1. A display device comprising:
   a substrate;
   wiring electrodes disposed on the substrate;
   semiconductor light emitting devices disposed on a wiring electrode of the wiring electrodes;
   an anisotropic conductive layer disposed between the semiconductor light emitting devices and formed of a mixture of conductive particles and an insulating material; and
   a light transmitting layer disposed between the semiconductor light emitting devices,
   wherein the anisotropic conductive layer is also disposed between the wiring electrodes,
   wherein the light transmitting layer is disposed on the anisotropic conductive layer disposed between the wiring electrodes,
   wherein the light transmitting layer comprises a light transmitting resin, and the light transmitting layer is directly in contact with the anisotropic conductive layer,
   wherein the light transmitting layer is configured to surround a side surface of each of the semiconductor light emitting devices,
   wherein a bottom most surface of the light transmitting layer is disposed lower than a bottom most surface of each of the semiconductor light emitting devices,
   wherein a maximum thickness of the anisotropic conductive layer disposed between the semiconductor light emitting devices, in view of a top surface of the substrate, is smaller than a distance between the top surface of the substrate and the bottom most surface of the semiconductor light emitting devices,
   wherein the anisotropic conductive layer is configured not to surround sides of the semiconductor light emitting devices,
   wherein the anisotropic conductive layer comprises a first region formed on the wiring electrode and a second region formed between the wiring electrodes,
   wherein a thickness of the wiring electrode disposed under the first region is greater than the maximum thickness of the anisotropic conductive layer disposed between the semiconductor light emitting devices, in view of the top surface of the substrate, and
   wherein the light transmitting layer is not vertically overlapped with the semiconductor light emitting devices, and
   wherein a top most surface of the light transmitting layer is a same with a top most surface of the semiconductor light emitting devices.

2. The display device according to claim 1, wherein an average thickness of the second region is smaller than a thickness of the wiring electrode.

3. The display device according to claim 1, wherein a part of the light transmitting layer protrudes through the wiring electrodes.

4. The display device according to claim 2, wherein a top surface of the first region of the anisotropic conductive layer is higher than that of the second region of the anisotropic conductive layer.

5. The display device according to claim 4, wherein the top surface of the second region of the anisotropic conductive layer is lower than that of the wiring electrodes.

6. The display device according to claim 5, wherein a bottom surface of the second region of the light transmitting layer is lower than that of the wiring electrodes.

7. The display device according to claim 1, wherein the light transmitting layer is spaced apart from the wiring electrodes.

8. The display device according to claim 1, wherein the light transmitting layer is not vertically overlapped with the semiconductor light emitting devices.

9. The display device according to claim 1, wherein the light transmitting layer comprises a first transmitting region formed on the wiring electrode and a second transmitting layer region formed between the wiring electrodes.

10. The display device according to claim 9, wherein an average thickness of the second transmitting region is greater than a thickness of the first transmitting region.

11. The display device according to claim 9, wherein an average thickness of the second transmitting region is greater than a thickness of the semiconductor light emitting devices.

12. The display device according to claim 9, wherein an average thickness of the second transmitting region is greater than a thickness of the wiring electrode.

13. The display device according to claim 1, wherein a topmost surface of the wiring electrodes is disposed higher than the bottom most surface of the light transmitting layer.

14. The display device according to claim 1, wherein a topmost surface of the light transmitting layer is not higher than a topmost surface of the semiconductor light emitting devices.

15. The display device according to claim 14, wherein a topmost surface of the anisotropic conductive layer is higher than the bottom most surface of the light transmitting layer.

16. The display device according to claim 1, wherein the conductive particles are interposed and compressed between the semiconductor light emitting devices and the wiring electrode to electrically connect the semiconductor light emitting devices and the wiring electrode.

17. The display device according to claim 1, wherein the conductive particles are disposed at an interface between the anisotropic conductive layer and the light transmitting layer.

18. The display device according to claim 1, wherein the conductive particles contact the semiconductor light emitting devices at a first side thereof and contacts the wiring electrode at a second side thereof that is opposite to the first side, so as to electrically connect the semiconductor light emitting devices and the wiring electrode.

19. The display device according to claim 1, wherein the bottom most surface of the light transmitting layer is disposed lower than a top most surface of the wiring electrode under the semiconductor light emitting devices disposed thereon.

* * * * *